(12) United States Patent
Yang et al.

(10) Patent No.: US 8,830,784 B2
(45) Date of Patent: Sep. 9, 2014

(54) NEGATIVE WORD LINE DRIVER FOR SEMICONDUCTOR MEMORIES

(75) Inventors: Chen-Lin Yang, Zhubei (TW); Wei Min Chan, Sindian (TW); Chung-Hsien Hua, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 375 days.

(21) Appl. No.: 13/273,369

(22) Filed: Oct. 14, 2011

(65) Prior Publication Data

US 2013/0094308 A1     Apr. 18, 2013

(51) Int. Cl.
*G11C 8/00* (2006.01)
*G11C 8/08* (2006.01)
*G11C 7/22* (2006.01)
*G11C 11/418* (2006.01)

(52) U.S. Cl.
CPC .. *G11C 8/08* (2013.01); *G11C 7/22* (2013.01); *G11C 11/418* (2013.01)
USPC ............. 365/230.06; 365/49.1; 365/154; 365/189.15; 365/189.16

(58) Field of Classification Search
CPC .... G11C 11/00; G11C 11/413; G11C 11/412; G11C 11/419; G11C 11/4085; G11C 11/40615; G11C 8/08; G11C 8/10; G11C 8/12; G11C 8/14
USPC .............. 365/154, 49.1, 226, 230.06, 189.16, 365/189.15
See application file for complete search history.

(56) References Cited

U.S. PATENT DOCUMENTS

| | | |
|---|---|---|
| 5,659,260 A | 8/1997 | Kajimoto et al. |
| 6,205,049 B1 | 3/2001 | Lien et al. |
| 6,411,160 B1 | 6/2002 | Riho et al. |
| 6,535,430 B2 * | 3/2003 | Ogura et al. ............. 365/185.23 |
| 6,728,151 B2 | 4/2004 | Joo |
| 6,961,278 B2 | 11/2005 | Jeong |
| 7,312,636 B2 * | 12/2007 | Lines .............................. 326/81 |
| 7,663,908 B2 | 2/2010 | Cheng et al. |
| 7,663,953 B2 | 2/2010 | Cheng et al. |
| 2003/0174533 A1 | 9/2003 | Ito |
| 2007/0133327 A1 | 6/2007 | Huang |
| 2007/0268764 A1 | 11/2007 | Kim et al. |
| 2012/0020146 A1 * | 1/2012 | Jung et al. ..................... 365/154 |

FOREIGN PATENT DOCUMENTS

KR       20020045959 A      6/2002

* cited by examiner

*Primary Examiner* — Tha-O H Bui
(74) *Attorney, Agent, or Firm* — Duane Morris LLP

(57) ABSTRACT

A semiconductor memory includes a word line driver and a negative voltage generator. The word line driver includes a first inverter configured to drive a word line at one of a first voltage supplied by a first voltage source and a second voltage supplied by a second voltage source. The negative voltage generator is configured to provide a negative voltage with respect to the second voltage to an input of the first inverter in response to a control signal for performing at least one of a read or a write operation of a memory bit cell coupled to the word line.

20 Claims, 6 Drawing Sheets

NEGATIVE WORD LINE DRIVER FOR SEMICONDUCTOR MEMORIES

FIELD OF DISCLOSURE

The disclosed circuits and methods relate to semiconductor memories. More specifically, the disclosed circuits and methods relate to semiconductor memories having negative word line drivers.

BACKGROUND

Static random access memories ("SRAM") include a plurality of cells disposed in rows and columns to form an array. Conventional SRAM cells include a plurality of transistors coupled to bit lines and word lines that are used to read and write a bit of data to the memory cell. Word line drivers are used to increase the voltage on the word line when data is to be written to or read from a bit cell in a particular row. However, increased loading on word lines can slow the rate at which the voltage on the word lines is increased, thereby degrading the read and write margin.

DETAILED DESCRIPTION

The disclosed semiconductor memories advantageously increases a rising edge slew rate of a word line by providing a negative voltage to a word line driver. The negative voltage may be provided to a single word line driver that drives an entire memory bit cell array or may be provided on a per word line basis with a negligible increase in leakage current and floor plan area.

Figure 1:
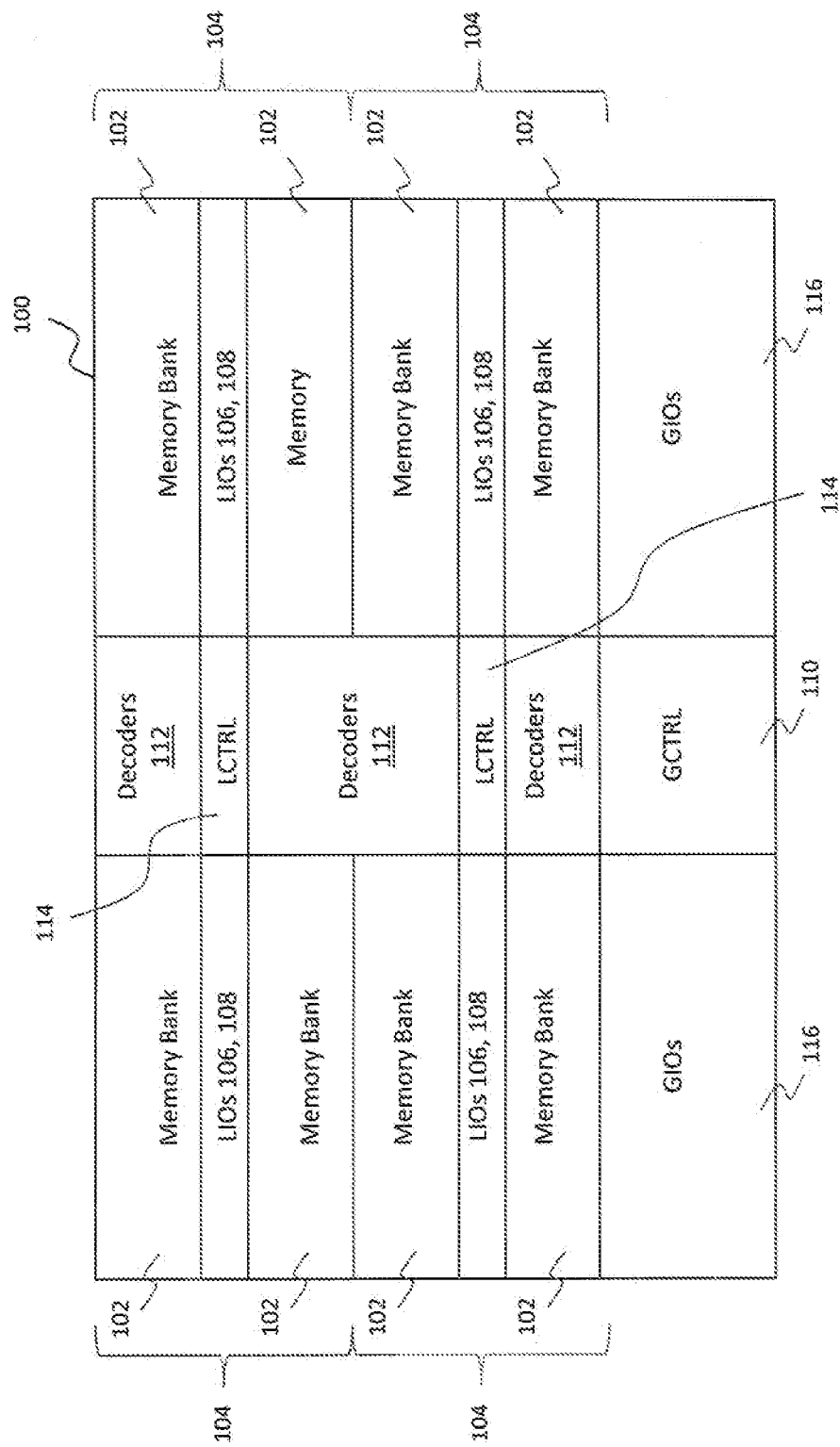
FIG. 1 is a layout view of one example of a semiconductor memory.

One example of an improved semiconductor memory 100 is illustrated in FIG. 1. In some embodiments, semiconductor memory 100 is a random access memory ("RAM") such as a static RAM ("SRAM") or a dynamic RAM ("DRAM"), although one skilled in the art will understand that the semiconductor memory 100 may be adapted as a read only memory ("ROM"). As shown in FIG. 1, semiconductor memory 100 includes a plurality of banks 102 of memory bit cells (FIG. 2) arranged in rows and columns. Each respective column may include a pair of complementary bit lines, e.g., BL and BLB, and each respective row includes at least one respective word line, WL. SRAM array 100 may be divided into one or more segments 104 with each segment 104 including a plurality of memory cell banks 102 separated by local input/output ("LIO") circuitry 106, 108. The reading from and writing to the memory cell banks 102 is controlled by global control ("GCTRL") circuitry 110, which is coupled to address decoders 112, local control ("LCTRL") circuitry 114, and global input/output ("GIO") circuitry 116.

For example, GCTRL circuitry 110, which may include a tracking clock (not shown) as well as a clock (not shown) for controlling the reading and writing to and from memory cells of the SRAM 100, provides an address and a control signal for reading data from or writing data to a memory cell in one of the segments 104. The address is decoded by one of the decoders 112, and LCTRL circuitry 114 identifies the type of operation being performed and transmits a signal to an LIO 106, 108 for controlling the data access in a segment 104.

Figure 2:
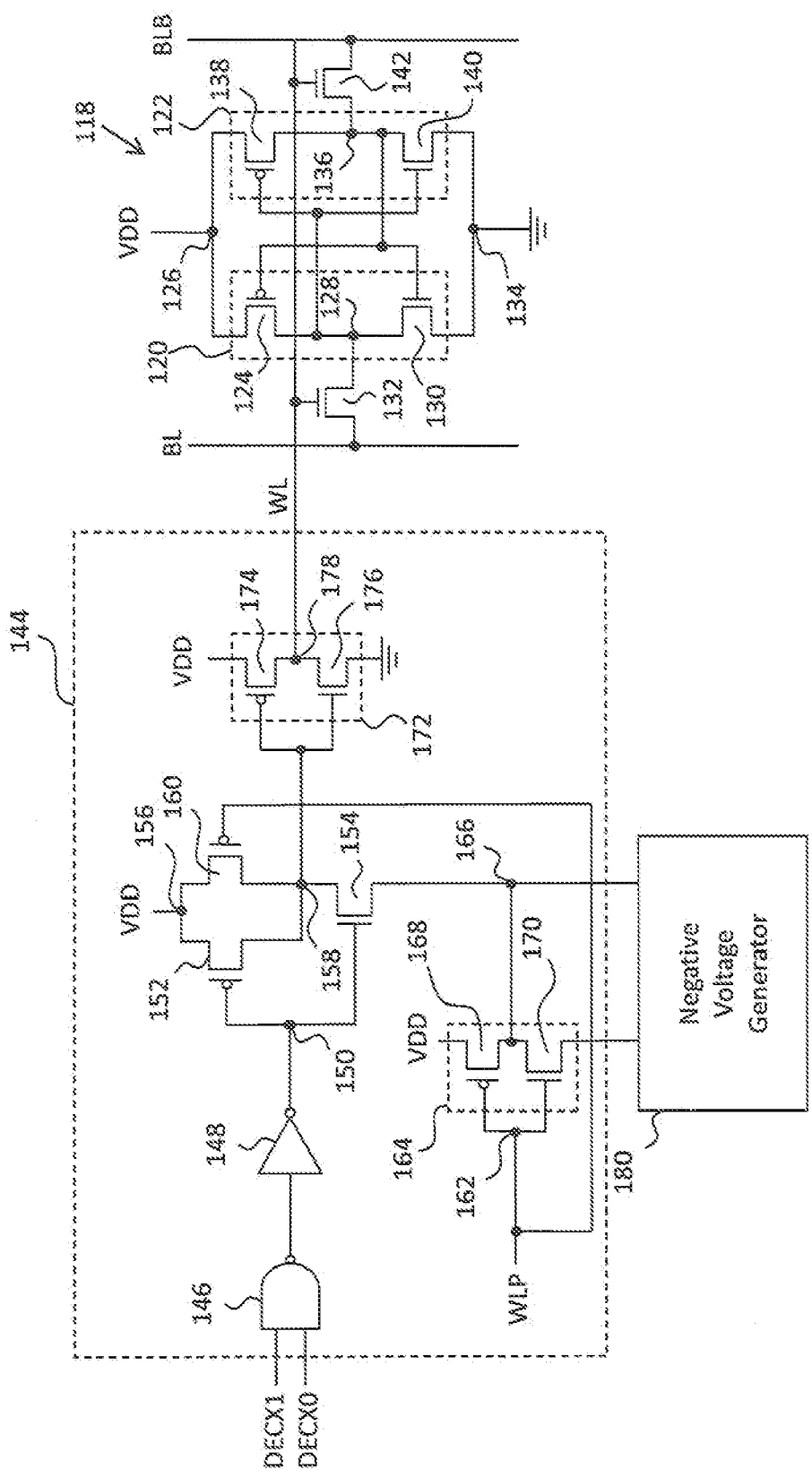
FIG. 2 illustrates one example of a word line driver in accordance with the semiconductor memory coupled to a negative voltage generator.

Decoders 112 may be coupled to a word line driver for driving a respective word line to a particular voltage in order to read data from or write data to a member bit cell. FIG. 2 illustrates a single bit cell 118 coupled to a word line driver circuit 144 that receives a negative voltage signal from a negative voltage generator 180, which may provide a negative voltage to a plurality of word line drivers 144 (not shown). Although only one bit cell 118 is illustrated in FIG. 2, one skilled in the art will understand that a plurality of bit cells 118 in a row may be driven by WL driver 144. Bit cell 118 includes a pair of cross-coupled inverters 120 and 122. Inverter 118 includes a PMOS transistor 124 having a source coupled to node 126, which is connected to a high voltage source such as VDD. The drain of transistor 124 is coupled to node 128, which serves as the output of inverter 120 and the input of inverter 122. Node 128 is coupled to the drain of NMOS transistor 130 and to the source of pass transistor 132. The source of transistor 130 is coupled to node 134, which is coupled to a low voltage supply such as ground or VSS. The gates of transistors 124 and 130 are coupled together at node 136, which serves as the input of inverter 120 and the output of inverter 122 and is coupled to the source of pass transistor 142.

Inverter 122 includes a PMOS transistor 138 and an NMOS transistor 140. Transistor 138 has a source coupled to node 126 and a drain coupled to node 136. NMOS transistor 140 has its drain coupled to node 136 and its source coupled to node 134. Node 136 is also coupled to pass transistor 142. Pass transistors 132 and 142 have their respective gates coupled to a WL. The drain of pass transistor 132 is coupled to bit line BL, and the drain of pass transistor 142 is coupled to bit line BLB.

The WL is coupled to WL driver 144, which includes a logic gate 146 configured to receive a pair of input signals, DECX1 and DECX0, and provide a decoded output signal to inverter 148. The output of inverter 148 is coupled to node 150, which is coupled to the gate of transistor 152 and to the gate of transistor 154. Transistor 152 has its source coupled to node 156 and its drain coupled to node 158. Node 156 is coupled to a high voltage supply such as VDD. Node 158 is coupled to the drain of transistor 154 and to the drain of transistor 160, which has its source coupled to node 156 and its gate coupled to input node 162 of inverter 164. Node 162 also receives a WL control signal WLP that controls data being read from or written to bit cell 118 that is coupled to the WL.

Transistor 154 has its source coupled to node 166, which serves as the output node of inverter 164 and is coupled to negative voltage generator 170. Inverter 164 includes a PMOS transistor 168 and an NMOS transistor 170. Transistor 168 has its source coupled a high voltage power supply, such as VDD, and its drain coupled to node 166. Transistor 170 has its drain coupled to node 166 and its source coupled to negative voltage generator 180.

Node 158 serves as the input for inverter 172, which includes a PMOS transistor 174 and an NMOS transistor 176.

Transistor 174 has its source coupled to a high voltage supply, such as VDD, its gate coupled to node 158, and its drain coupled to node 178, which serves as the output of inverter 172. Transistor 176 has its source coupled to a low voltage supply, such as ground or VSS, its drain coupled to node 178, and its gate coupled to node 158. Node 178 is coupled to the WL coupled to bit cell 118.

Negative voltage generator 180 is configured to provide a negative voltage to node 158 to increase the source gate voltage, $V_{SG}$, of transistor 174. The increased $V_{SG}$ of transistor 174 advantageously boosts the pull-up capability of the WL thereby providing better read and write margins. Negative voltage generator 180 may be implemented in a variety of ways.

Figure 3:
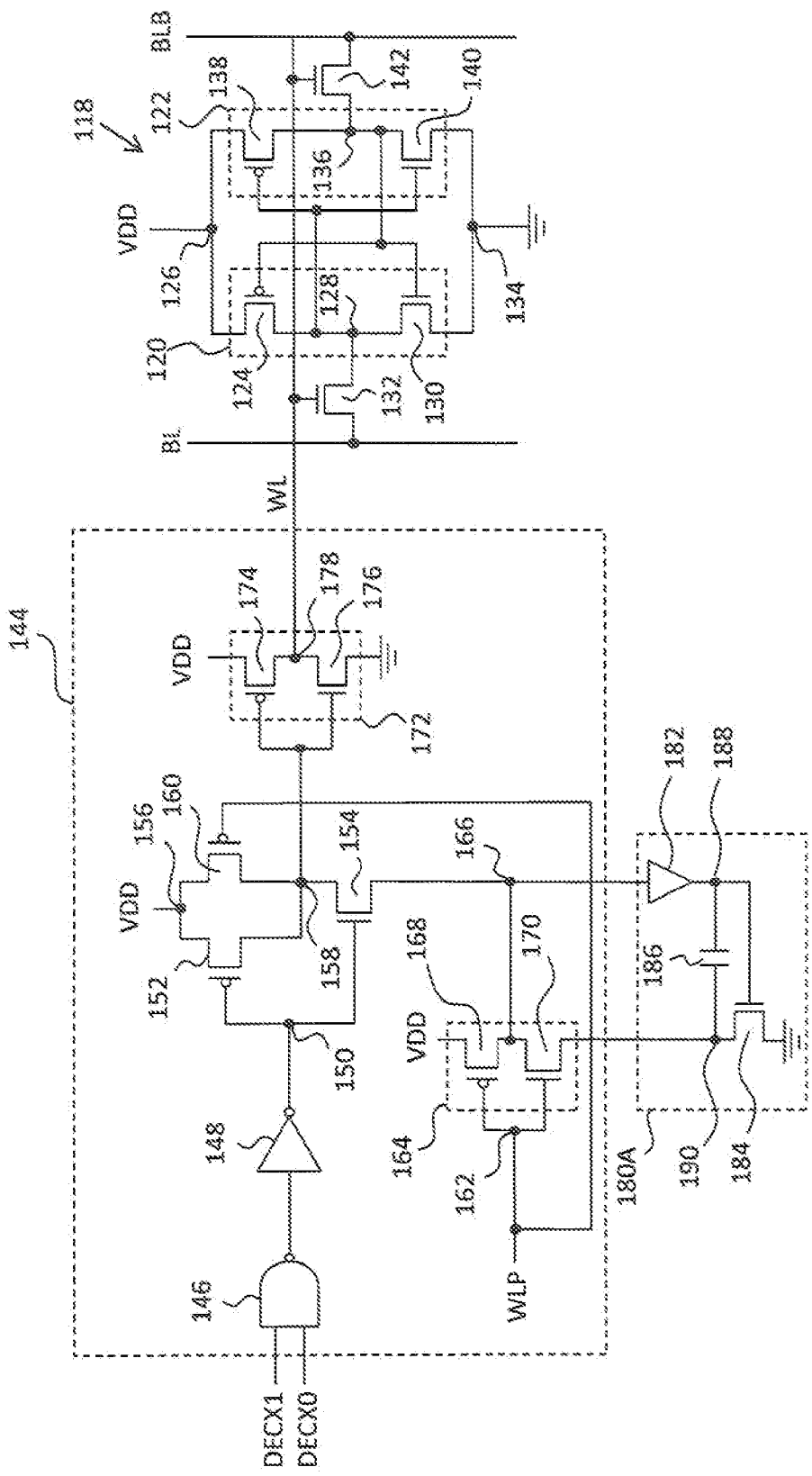
FIG. 3 illustrates another example of a word line driver coupled to a negative voltage generator.

For example, FIG. 3 illustrates one example of a WL driver 144 in which negative voltage generator 180A includes a timing circuit 182 coupled to a gate of transistor 184 and to a capacitor 186. Timing circuit 182 may be a buffer having an input coupled to node 166 and an output coupled to node 188. Node 188 is coupled to capacitor 186 and to a gate of transistor 184. Transistor 184 has its source coupled to a low voltage supply, such as VSS or ground, and its drain coupled to node 190. Node 190 is coupled to capacitor 186 and to the source of transistor 170 of inverter 164. Example types of capacitor 186 include, but are not limited to, metal oxide semiconductor ("MOS") capacitors and a metal-insulator-metal ("MIM") capacitors, to name a few possible types.

Figure 4:
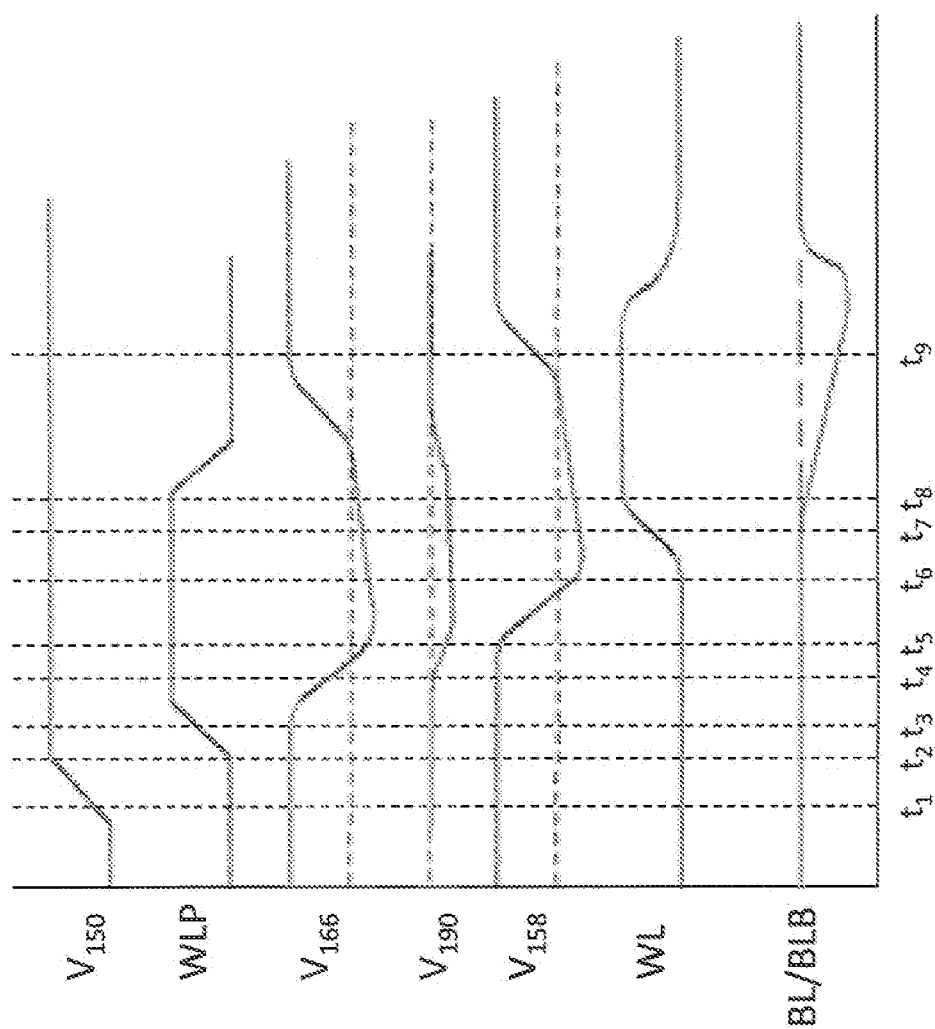
FIG. 4 is a timing diagram of various signals of the word line driver and negative voltage generator illustrated in FIG. 3.

The operation of WL driver 144, including negative voltage generator 180A, is described with reference to FIGS. 3 and 4. The DECX0 and DECX1 signals are received at logic gate 146. When the DECX0 and DECX1 signals received at logic gate 146, which is illustrated as a NAND gate, are logic ones, logic gate 146 outputs a logic zero to inverter 148. The output of inverter 148 causes the voltage at node 150, $V_{150}$, to transition at time $t_1$ from a logic zero to a logic one in response to the logic zero being received at the input of inverter 148. The logic one at node 150 turns transistor 152 into a non-current-conducting 'off' state, and turns transistor 154 into a current-conducting 'on' state.

At time $t_2$, control signal WLP transitions from a logic zero to a logic one. The logic one of WLP is received at the gate of transistor 160, which results in transistor 160 being in an off state such that VDD is effectively disconnected from node 158. The logic one of the WLP control signal is also received at input node 162 of inverter 164. The logic one at node 162 turns transistor 168 off and turns on transistor 170 such that node 166 is coupled to node 190 of negative voltage generator 180A.

At time $t_3$, the voltage at node 166, $V_{166}$, begins to be pulled down in response to the logic one of WLP being received at node 162. As the voltage at node 162 is being pulled down, buffer 182 provides the voltage to node 188, which results in transistor 184 being turned on such that node 190 is coupled to ground through transistor 184.

At time $t_4$, the voltage at node 190, $V_{190}$, is pulled below ground due to capacitor 186 providing a coupling capacitance between nodes 188 and 190. Node 190 being pulled to a voltage less than ground (or VSS) results in the voltage at node 158, $V_{158}$, beginning to be pulled low as node 158 is coupled to node 190 through transistors 154 and 174 at time $t_5$.

The voltage at node 158 continues to decrease between times $t_5$ and $t_6$ at which time the WL begins to transition to a logic one in response to the negative voltage at node 158. For example, the negative voltage at node 158 turns off transistor 176 and turns on transistor 174 such that VDD is coupled to node 178. Transistor 178 turns on more rapidly in response to a negative voltage being received at node 158 than it would if a logic zero, e.g., a ground voltage, is received at node 158 as the $V_{SG}$ of transistor 174 is increased. The faster turning on of transistor 174 results in the voltage at node 178 increasing to VDD more rapidly.

At time $t_7$, the one of the bit lines BL or BLB is used to sense voltage resembling data from, or write data to, bit cell 118. Data is written to or read from bit cell 118 through pass transistors 132 and 142, which are turned on in response to receiving the logic one of the WL at their respective gates.

At time $t_8$, control signal WLP begins to transition from a logic one to a logic zero. The transition of control signal WLP from a logic one to a logic zero results in transistors 160 and 168 turning on when the voltage at node 162 is below the threshold voltage for the transistors. Transistor 168 being turned on results in VDD being coupled to node 166, which increases the voltage at node 166, and transistor 160 being turned on results in VDD being coupled to node 158 through transistor 160.

The transition of control signal WLP from a logic one to a logic zero also results in transistor 170 turning off when the voltage at node 162 falls below the threshold voltage for transistor 170. With transistor 170 off and transistor 168 at a logic one, the voltage at node 188 increases to a logic one as the voltage at node 166 is passed through buffer 182. A logic one at node 188 results in transistor 184 turning on, which couples node 190 to ground thereby increase $V_{190}$ to zero volts at time $t_9$ when the voltage at node 166, $V_{166}$, reaches a logic one.

Figure 5:
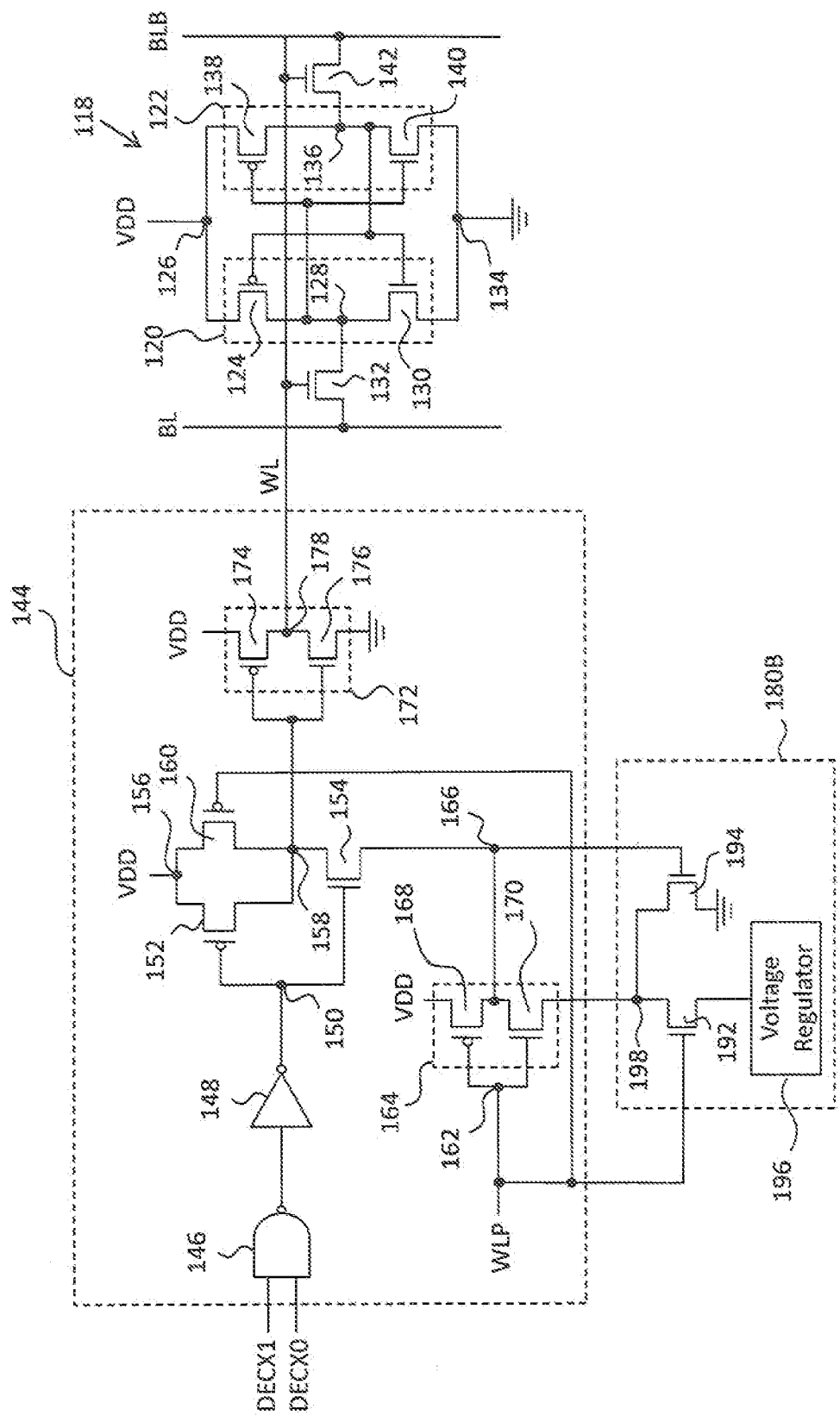
FIG. 5 illustrates another example of a negative voltage generator coupled to a word line driver.

FIG. 5 illustrates another example of a negative voltage generator 180. As shown in FIG. 5, voltage generator 180B includes a pair of transistors 192 and 194 and a voltage regulator 196. Transistor 192 has a gate coupled to node 162 and is configured to receive control signal WLP. The drain of transistor 192 is coupled to node 198, and the source of transistor 192 is coupled to voltage regulator 196. Transistor 194 has its drain coupled to node 198, which is also coupled to the source of transistor 170, its source coupled to a low voltage source, such as ground or VSS, and its gate coupled to node 166. Voltage regulator 196 is configured to output a negative voltage with respect to ground to the source of transistor 192.

In operation, the DECX0 and DECX1 signals are received at logic gate 146, which may be a NAND gate as illustrated in FIG. 5. Logic gate 146 outputs a logic zero to inverter 148 when the DECX0 and DECX1 signals are logic ones. For all other combination of inputs, logic gate 146 outputs a logic one to inverter 148. Inverter 148 inverts the input voltage it receives from logic gate 146 and provides the inverse signal to node 150. If the output of inverter is logic zero, then transistor 152 is turned on and transistor 154 is turned off such that the voltage of VDD is coupled to node 158. The voltage of VDD being coupled to node 158 turns off transistor 174 and turns on transistor 176 such that the WL is coupled to the low voltage supply through transistor 176.

Control signal WLP is configured such that it is a logic zero when the output of logic gate 146 is a logic one. With control signal WLP a logic zero, transistor 168 is turned on and transistor 170 is turned off such that the voltage of VDD is coupled to node 166. The logic zero at node 162 also results in transistor 192 being turned off such that the negative voltage provided by voltage regulator is not connected to node 198. Transistor 160 is also turned off when WLP is a logic zero. The voltage of VDD being coupled to node 166 turns on transistor 194 such that the voltage of the low voltage source, which is illustrated as being ground, is coupled to node 198 through transistor 194.

When the output of logic gate 146 is a logic zero, inverter 148 outputs a logic one to node 150. The logic one at node 150 turns off transistor 152 and turns on transistor 154. Transistor 154 being on couples node 158 to node 166 through transistor 154. Control signal WLP transitions from a logic zero to a logic one at approximately the same time as logic gate 146 outputs a logic zero. The logic one of WLP turns off transistor 160, which disconnects VDD from node 158 in combination with transistor 152 being in an off state.

The logic one of control signal WLP also turns on transistors 170 and 192 and turns off transistor 168. Transistor 168 being off disconnects VDD from node 166, and transistor 170 being on couples node 198 to node 166. Initially, the voltage at node 198 is a logic zero, which is coupled through node 166 to turn off transistor 194. Transistor 192 being on couples the voltage provided by voltage regulator 196, which is a negative voltage relative to ground or VSS, to node 198. The voltage of node 198 is coupled through transistors 170 and 154 to node 158.

The negative voltage at node 158 results in transistor 174 turning on more quickly and transistor 176 turning off more quickly than if the voltage at node 158 was at ground. Transistor 176 being off disconnects the low voltage source from node 178, and transistor 174 being on couples the voltage of VDD to node 178 to increase the WL voltage to VDD.

Although the negative voltage generators 180 have been described as supplying a negative voltage to a plurality of word line drivers of a semiconductor memory 100 and/or to a segment 104 of a semiconductor memory 100, one skilled in the art will understand that a plurality of voltage generators may be implemented to provide a negative voltage to a respective word line driver. For example, FIG. 6 illustrates one example of a negative voltage generator configured to provide a negative voltage to a respective WL driver 144.

Figure 6:
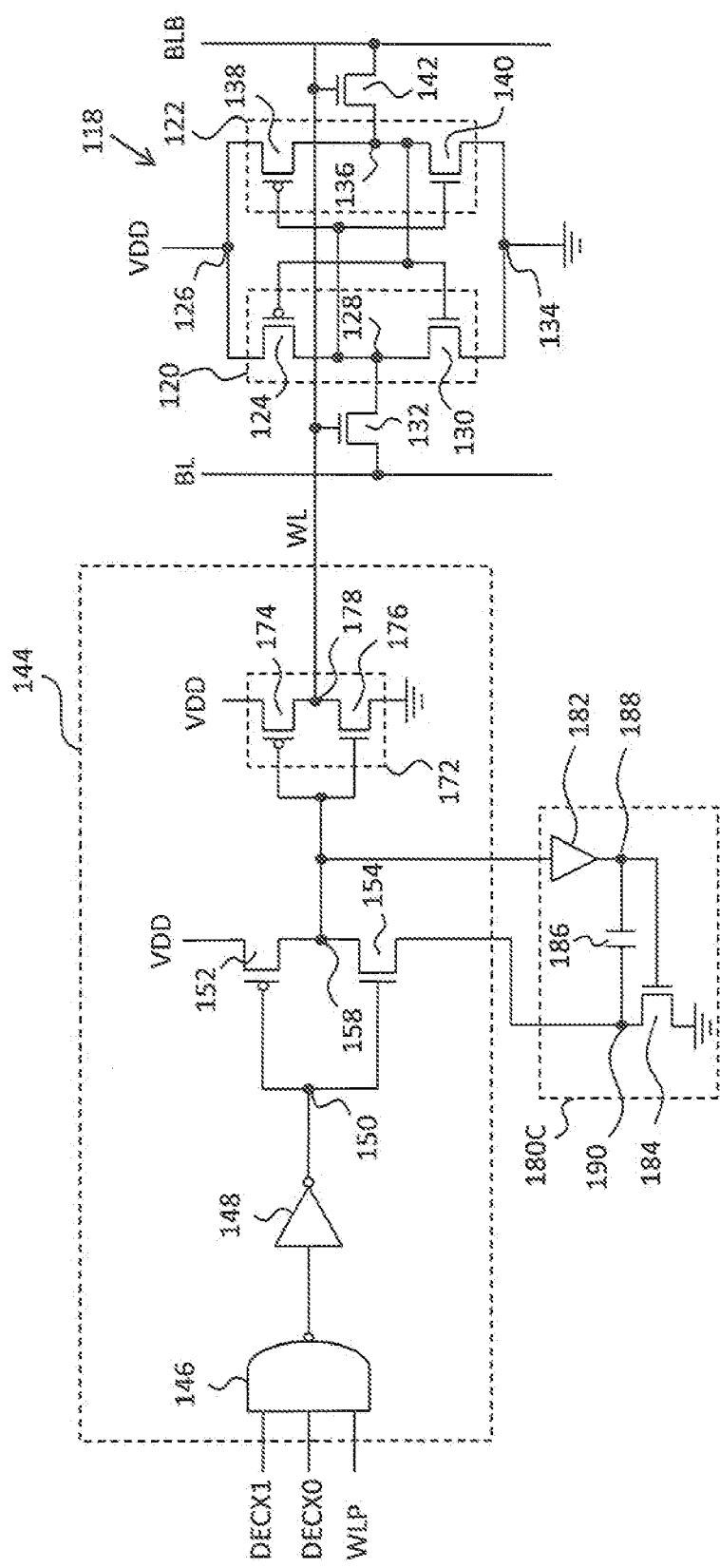
FIG. 6 illustrates another example of a negative voltage generator configured to provide a negative voltage to a respective word line driver.

As shown in FIG. 6, logic gate 146 receives input signals DECX1 and DECX0 and control signal WLP at respective inputs. The output of logic gate 146 is coupled to the input of inverter 148, which has its output coupled to node 150. Node 150 is coupled to the gate of PMOS transistor 152 and to the gate of NMOS transistor 154. Transistor 152 has its source coupled to high voltage supply, which may be VDD, and its drain coupled to node 158. Transistor 154 has its drain coupled to node 158 and its source coupled to node 190 of negative voltage generator 180C.

Node 158 serves as the input of inverter 172, which includes PMOS transistor 174 and NMOS transistor 176. Transistor 174 has its source coupled to high voltage source, e.g., VDD, and its drain coupled to node 178, which is coupled to the WL. Transistor 176 has its drain coupled to node 178 and its source coupled to a low voltage source, such as ground or VSS.

Negative voltage generator 180C includes a timing circuit 182, a transistor 184, and a capacitor 186. Timing circuit 182 may be a buffer having an input coupled to node 158 and an output coupled to node 188. Node 188 is coupled to capacitor 186 and to the gate of transistor 184. Transistor 184 has its source coupled to a low voltage supply, such as VSS or ground, and its drain coupled to node 190. Node 190 is coupled to capacitor 186 and to the source of transistor 154. Example types of capacitor 186 include, but are not limited to, metal oxide semiconductor ("MOS") capacitors and a metal-insulator-metal ("MIM") capacitors, to name a few possible types.

Logic gate 146 outputs a logic zero when each of its inputs, DECX0, DECX1, and WLP, are all logic ones and outputs a logic one for all other combinations of inputs. When logic gate 146 outputs a logic one, inverter 148 outputs a logic zero to node 150. The logic zero at node 150 turns on transistor 152 and turns off transistor 154 such that the voltage of VDD is coupled to node 158 and node 190 is disconnected from node 158.

The voltage of VDD at node 158 turns off transistor 174 and turns on 176 of inverter 172 such that the low voltage source is coupled to the WL. The voltage of VDD at node 158 is passed by buffer 182 to node 188 after a delay. With node 188 at a high voltage, transistor 184 is turned on to coupled node 190 to a low voltage. The voltage across capacitor 186, which is disposed between nodes 188 and 190, is equal to VDD.

When logic gate 146 outputs a logic zero, inverter 148 outputs a logic one to node 150. The logic zero at node 150 turns off transistor 152 and turns on transistor 154 such that VDD is disconnected from node 158 and node 158 is coupled to node 190. Node 190 initially has a voltage equal to ground (or VSS if the source of transistor 184 is coupled to VSS), but is pulled to a negative voltage by the capacitive coupling between nodes 188 and 190 provided by capacitor 186.

The negative voltage is coupled to node 158 through transistor 154, which is in an on state as described above. The negative voltage at node 158 results in transistor 174 turning on more quickly and transistor 176 turning off more quickly than if the voltage at node 158 was at ground. Transistor 176 being off disconnects the low voltage source from node 178, and transistor 174 being on couples the voltage of VDD to node 178 to increase the WL voltage to VDD.

In some embodiments, a semiconductor memory includes a word line driver and a negative voltage generator. The word line driver includes a first inverter configured to drive a word line at one of a first voltage supplied by a first voltage source and a second voltage supplied by a second voltage source. The negative voltage generator is configured to provide a negative voltage with respect to the second voltage to an input of the first inverter in response to a control signal for performing at least one of a read or a write operation of a memory bit cell coupled to the word line.

In some embodiments, a semiconductor memory includes a plurality of word lines each coupled to a respective plurality of bit cells, at least one word line driver coupled to at least one of the plurality of word lines, and at least one negative voltage generator. The at least one word line driver includes a first inverter configured to drive the at least one word line at one of a first voltage supplied by a first voltage source and a second voltage supplied by a second voltage source. The at least one negative voltage generator is configured to provide a negative voltage with respect to the second voltage to an input of the first inverter in response to a control signal for performing at least one of a read or a write operation of a memory bit cell coupled to the at least one of the plurality of word lines.

In some embodiments, a semiconductor memory includes a plurality of word lines, at least one word line driver coupled to at least one of the plurality of word lines, and at least one negative voltage generator. Each of the plurality of word lines is coupled to a respective plurality of bit cells. The at least one word line driver includes a first inverter configured to drive the at least one word line at one of a first voltage supplied by a first voltage source and a second voltage supplied by a second voltage source. The at least one negative voltage generator is configured to provide a negative voltage with respect to the second voltage to an input of the first inverter in response to a control signal for performing at least one of a read or a write operation of a memory bit cell coupled to the at least one of the plurality of word lines. The at least one negative voltage generator includes a timing device, a first transistor, and a capacitor. The timing device has an input coupled to a first node that is coupled to the input of the first inverter and has an output coupled to a second node. The first transistor has a gate coupled to the second node, a source coupled to the second voltage supply, and a drain coupled to a third node. The capacitor is coupled to the second node and to the third node and is configured to generate the negative voltage in response to the control signal.

The improved negative voltage generator circuits described herein advantageously increase the speed at which a WL is pulled up to a high voltage by a WL driver circuit with minimal impacts on bit cell reliability. The coupling capacitor that in some embodiments generates the negative voltage may be located in empty spaces around a WL decoder such that the area impact of the improved design is approximately zero percent.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor memory, comprising:
   a word line driver including a first inverter configured to drive a word line at one of a first voltage supplied by a first voltage source and a second voltage supplied by a second voltage source; and
   a negative voltage generator configured to provide a negative voltage with respect to the second voltage to an input of the first inverter in response to a control signal for performing at least one of a read or a write operation of a memory bit cell coupled to the word line,
   wherein the negative voltage generator includes
       a timing device having an input coupled to a first node that is coupled to the input of the first inverter and having an output coupled to a second node;
       a first transistor having a are coupled to the second node a source coupled to the second voltage supply, and a drain coupled to a third node; and
       a capacitor coupled to the second node and to the third node and configured to generate the negative voltage in response to the control signal.

2. The semiconductor memory of claim 1, wherein the word line driver includes a second inverter having an input configured to receive the control and an output coupled to the first node, the second inverter configured to drive the first node to one of the first voltage or the negative voltage in response to the control signal.

3. The semiconductor memory of claim 2, wherein the word line driver includes:
   a second transistor having a source coupled to the first voltage supply, a drain coupled to the input of the first inverter, and a gate configured to receive a decoded signal from a logic gate; and
   a third transistor having a drain coupled to the input of the first inverter, a source coupled to the first node, and a gate configured to receive the decoded signal from the logic gate.

4. The semiconductor memory of claim 3, wherein the word line driver includes a fourth transistor having a source coupled to the first voltage supply, a drain coupled to the input of the first inverter, and a gate configured to receive the control signal.

5. The semiconductor memory of claim 1, further comprising a plurality of word line drivers each configured to receive the negative voltage from the negative voltage generator.

6. The semiconductor memory of claim 1, further comprising a plurality of word line drivers each configured to receive the negative voltage from a respective negative voltage generator.

7. The semiconductor memory of claim 1, wherein
   the word line driver includes
       a third transistor having a source coupled to the first voltage supply, a drain coupled to the input of the first inverter, and a gate configured to receive a decoded signal from a logic gate in response to the control signal, and
       a fourth transistor having a drain coupled to the input of the first inverter and a gate configured to receive the decoded signal.

8. A semiconductor memory, comprising:
   a plurality of word lines each coupled to a respective plurality of bit cells;
   at least one word line driver coupled to at least one of the plurality of word lines, the at least one word line driver including a first inverter configured to drive the at least one word line at one of a first voltage supplied by a first voltage source and a second voltage supplied by a second voltage source; and
   at least one negative voltage generator configured to provide a negative voltage with respect to the second voltage to an input of the first inverter in response to a control signal for performing at least one of a read or a write operation of a memory bit cell coupled to the at least one of the plurality of word lines, the negative voltage generator including
       a first transistor having a source coupled to the second voltage supply and a gate coupled to a first node that is coupled to the input of the first inverter; and
       a second transistor having a gate configured to receive the control signal, a source coupled to a voltage regulator configured to output the negative voltage with respect to the second voltage, and a drain coupled to a second node that is coupled to a drain of the first transistor.

9. The semiconductor memory of claim 8, wherein the at least one negative voltage generator provides the negative voltage to each of the plurality of word line drivers.

10. The semiconductor memory of claim 8, wherein each of the plurality of word line drivers receives a negative voltage from a respective negative voltage generator.

11. The semiconductor memory of claim 8, wherein the word line driver includes a second inverter having an input configured to receive the control signal and an output coupled to the first node, the second inverter configured to drive the first node to one of the first voltage or the negative voltage in response to the control signal.

12. The semiconductor memory of claim 8, wherein the at least one word line driver includes
   a third transistor having a source coupled to the first voltage supply, a drain coupled to the input of the first inverter, and a gate configured to receive a decoded signal from a logic gate in response to the control signal, and
   a fourth transistor having a drain coupled to the input of the first inverter and a gate configured to receive the decoded signal.

13. A semiconductor memory, comprising:
   a plurality of word lines each coupled to a respective plurality of bit cells;
   at least one word line driver coupled to at least one of the plurality of word lines, the at least one word line driver including a first inverter configured to drive the at least one word line at one of a first voltage supplied by a first voltage source and a second voltage supplied by a second voltage source; and at least one negative voltage generator configured to provide a negative voltage with respect to the second voltage to an input of the first inverter in response to a control signal for performing at least one of a read or a write operation of a memory bit cell coupled to the at least one of the plurality of word lines, the at least one negative voltage generator including:

a timing device having an input coupled to a first node that is coupled to the input of the first inverter and having an output coupled to a second node;

a first transistor having a gate coupled to the second node, a source coupled to the second voltage supply, and a drain coupled to a third node; and a capacitor coupled to the second node and to the third node and configured to generate the negative voltage in response to the control signal.

14. A semiconductor memory, comprising:
a word line driver including a first inverter configured to drive a word line at one of a first voltage supplied by a first voltage source and a second voltage supplied by a second voltage source; and
a negative voltage generator configured to provide a negative voltage with respect to the second voltage to an input of the first inverter in response to a control signal for performing at least one of a read or a write operation of a memory bit cell coupled to the word line, the negative voltage generator including
a first transistor having a source coupled to the second voltage supply and a gate coupled to a first node that is coupled to the input of the first inverter; and
a second transistor having a gate configured to receive the control signal, a source coupled to a voltage regulator configured to output the negative voltage with respect to the second voltage, and a drain coupled to a second node that is coupled to a drain of the first transistor.

15. The semiconductor memory of claim 14, wherein the word line driver includes a second inverter having an input configured to receive the control signal and an output coupled to the first node, the second inverter configured to drive the first node to one of the first voltage or the negative voltage in response to the control signal.

16. The semiconductor memory of claim 15, further comprising:
a third transistor having a source coupled to the first voltage supply, a drain coupled to the input of the first inverter, and a gate configured to receive a decoded signal from a logic gate; and
a fourth transistor having a drain coupled to the input of the first inverter, a source coupled to the first node, and a gate configured to receive the decoded signal from the logic gate.

17. The semiconductor memory of claim 16, further comprising a fifth transistor having a source coupled to the first voltage supply, a drain coupled to the input of the first inverter, and a gate configured to receive the control signal.

18. The semiconductor memory of claim 14, wherein the word line driver includes
a third transistor having a source coupled to the first voltage supply, a drain coupled to the input of the first inverter, and a gate configured to receive a decoded signal from a logic gate in response to the control signal, and a fourth transistor having a drain coupled to the input of the first inverter and a gate configured to receive the decoded signal.

19. A semiconductor memory, comprising:
a word line driver including
a first inverter configured to drive a word line at one of a first voltage supplied by a first voltage source and a second voltage supplied by a second voltage source,
a first transistor having a source coupled to the first voltage supply, a drain coupled to the input of the first inverter, and a gate configured to receive a decoded signal from a logic gate in response to the control signal, and
a second transistor having a drain coupled to the input of the first inverter and a gate configured to receive the decoded signal; and
a negative voltage generator configured to provide a negative voltage with respect to the second voltage to an input of the first inverter in response to a control signal for performing at least one of a read or a write operation of a memory bit cell coupled to the word line, the negative voltage generator including
a buffer having an input coupled to the input of the first inverter and an output coupled to a first node,
a third transistor having a source coupled to the second voltage supply, a gate coupled to the first node, and a drain coupled to the source of the second transistor, and
a capacitor coupled to the first node and to a second node disposed between the drain of the third transistor and the source of the second transistor.

20. A semiconductor memory, comprising:
a plurality of word lines each coupled to a respective plurality of bit cells;
at least one word line driver coupled to at least one of the plurality of word lines, the at least one word line driver including a first inverter configured to drive the at least one word line at one of a first voltage supplied by a first voltage source and a second voltage supplied by a second voltage source, the at least one word line driver including
a first transistor having a source coupled to the first voltage supply, a drain coupled to the input of the first inverter, and a gate configured to receive a decoded signal from a logic gate in response to the control signal, and
a second transistor having a drain coupled to the input of the first inverter and a gate configured to receive the decoded signal; and
at least one negative voltage generator configured to provide a negative voltage with respect to the second voltage to an input of the first inverter in response to a control signal for performing at least one of a read or a write operation of a memory bit cell coupled to the at least one of the plurality of word lines, the at least one negative voltage generator including
a buffer having an input coupled to the input of the first inverter and an output coupled to a first node,
a third transistor having a source coupled to the second voltage supply, a gate coupled to the first node, and a drain coupled to the source of the second transistor, and
a capacitor coupled to the first node and to a second node disposed between the drain of the third transistor and the source of the second transistor.

* * * * *

UNITED STATES PATENT AND TRADEMARK OFFICE
CERTIFICATE OF CORRECTION

Page 1 of 1

PATENT NO. : 8,830,784 B2
APPLICATION NO. : 13/273369
DATED : September 9, 2014
INVENTOR(S) : Chen-Lin Yang et al.

It is certified that error appears in the above-identified patent and that said Letters Patent is hereby corrected as shown below:

In the Claims:

Claim 1, Column 7, Line 38 – delete "are" and insert -- gate --.

Claim 1, Column 7, Line 38 – delete "node" and insert -- node, --.

Signed and Sealed this
Twenty-first Day of July, 2015

Michelle K. Lee
*Director of the United States Patent and Trademark Office*